United States Patent [19]

Huntley

[11] 4,245,202
[45] Jan. 13, 1981

[54] FLOATING GYRATOR HAVING A CURRENT CANCELLATION CIRCUIT

[75] Inventor: Christopher R. Huntley, Burnaby, Canada

[73] Assignee: GTE Lenkurt Electric (Canada) Ltd., Burnaby, Canada

[21] Appl. No.: 45,164

[22] Filed: Jun. 4, 1979

[51] Int. Cl.$^3$ ............................................. H03H 11/50
[52] U.S. Cl. ..................................... 333/215; 307/295
[58] Field of Search ...................... 333/215; 330/109; 307/229, 295

[56] References Cited

U.S. PATENT DOCUMENTS

| | | | |
|---|---|---|---|
| 3,413,576 | 11/1968 | Sheahan | 333/215 |
| 3,493,901 | 2/1970 | Deboo | 333/215 |

OTHER PUBLICATIONS

Sheahan, *Gyrator-Flotation Circuit*, Electronics Letters, Jan. 1967, vol. 3, No. 1, pp. 39, 40.
Reddy, *Some New Operational-Amplifier Circuits, etc.*, IEEE Trans. on Circuits and Systems, Mar. 1976, pp. 171-173.

*Primary Examiner*—Paul L. Gensler
*Attorney, Agent, or Firm*—Leonard R. Cool

[57] ABSTRACT

A network simulating an ungrounded inductor includes an active gyrator circuit which employs an operational amplifier, said gyrator being a two port device having an ungrounded port, and a grounded port. The ungrounded port is terminated in a capacitor C so as to provide an input impedance, Zin, looking into the grounded port, which simulates an inductor: $Zin = e1/i1 = j\omega R^2 C$, where $\omega = 2\pi f$, e1 the voltage across the port and i1 is the current into the port. A current i2 is developed in the gyrator circuit, from the operational amplifier output, and appears as an extraneous current at the grounded terminal of the grounded port. An active network including a second operational amplifier is connected to the active gyrator circuit and is arranged to provide a current i3 which is equal in value to but opposite in sign from said i2 current. The current i3 is combined with the i1 and i2 currents at the grounded terminal. Because of its amplitude and sign the current i3 effectively cancels the i2 current. Thus, only the current i1 appears to pass into and out from the terminals of the grounded port and a simulated ungrounded inductor is obtained.

4 Claims, 2 Drawing Figures

FLOATING GYRATOR HAVING A CURRENT CANCELLATION CIRCUIT

BACKGROUND OF THE INVENTION

Field Of The Invention

This invention relates generally to gyrator circuits and, more particularly, to gyrator circuits used in an inductance simulation role and in which simulation of an ungrounded inductor is desired.

Background Description

Conventional electrical filters are two port networks presently made up of serial and parallel combinations of inductors and capacitors, designed to operate between resistive terminating impedances. In special cases, it is possible to replace some or all of the reactive elements by electro-mechanical resonators, but usually it is not. In attempting to reduce the size and weight of an inductor-capacitor filter, the main limiting factor is the inductor which, in order to provide the necessary high quality factor, must have a relatively large and heavy iron or ferrite core.

An alternative to attempting to make smaller inductors is to devise a circuit which has the same transmission characteristic but which uses no inductors. There are techniques for accomplishing this result, and networks so derived have come to be known as RC active filters. The principal disadvantage of most of these RC active filters is that their performance is excessively sensitive to tolerances on the components.

The one exception is to take the conventional inductor-capacitor ladder filter, which one would use if no size reduction were required, and replace each inductor by the input to a gyrator, the output of which is loaded with a capacitor. The gyrator was first proposed and described by B. Tellegen in an article entitled "The Gyrator, A New Electric Element" in Philips Research Report, 1948, pp 81–101.

A gyrator is a non-reciprocal 2-port network which presents an impedance at one port proportional to the reciprocal of the impedance attached to a second port. In particular it simulates an inductor when the second port is connected to a capacitor, and as such is useful for active filter networks. A number of gyrator configurations have been proposed most of which employ two amplifiers. One which has been given wide acceptance was disclosed in an article by R. H. S. Riordan, entitled "Simulated Inductors Using Differential Amplifiers," Electronic Letters, 3, pp 50–51, February 1967. More recently single amplifier gyrators have been described most of which have been of the lossy or non-ideal type. One which is an ideal gyrator is described in an article entitled "New Active-Gyrator Circuit," Electronic Letters, 10, pp 261–262, 1974, by H. J. Orchard, and A. M. Willson, Jr.

A problem with the gyrators just mentioned is that the port which is to be connected into the filter circuit is grounded and thus replacement of the floating inductors of a network by such gyrators would create an undesirable result. Floating or semi-floating gyrator circuits have been developed, but these are either of the lossy (poor Q) type or very complex in comparison with this invention.

SUMMARY OF THE INVENTION

A network for simulating an ungrounded inductor comprises a conventional grounded gyrator circuit which has an ungrounded port and a grounded port, plus a cancellation circuit. A capacitor C is connected across the terminal of the ungrounded port and thus provides an input impedance looking into the grounded port, which simulates an inductor. A current i2 is developed in the active circuit and appears at the grounded terminal of the grounded port. The cancellation circuit is connected to the active gyrator circuit and this cancellation circuit derives a current i3 which is equal to but opposite in sign from current i2 so as to cancel the effect of the i2 current and thereby simulate an ungrounded inductor.

DETAILED DESCRIPTION OF THE INVENTION

Figure 1:
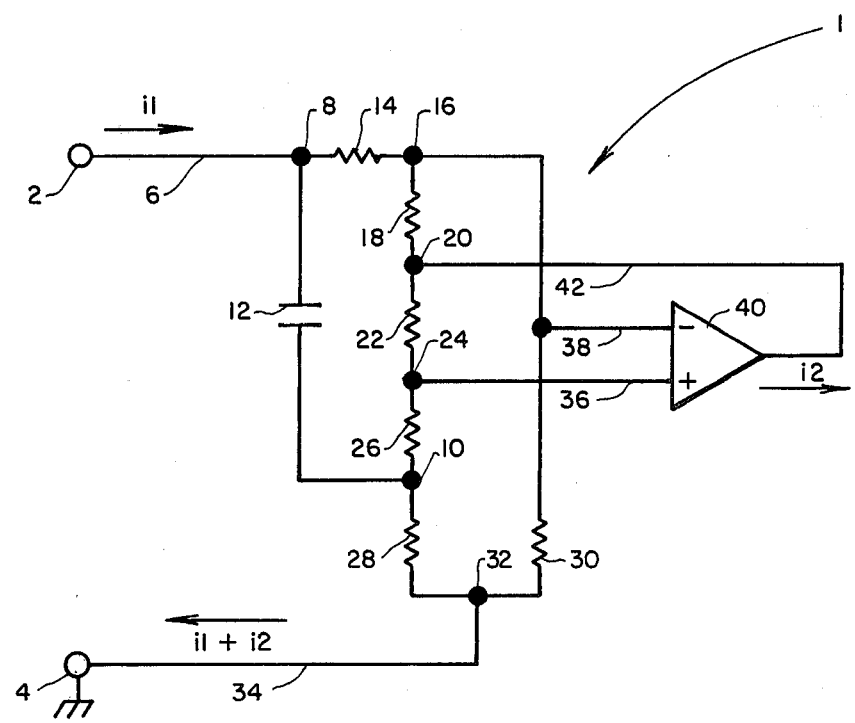
FIG. 1 is a circuit diagram of an ideal active gyrator which employs only one amplifier and which has one terminal grounded.

The operational characteristics of the single amplifier gyrator shown in FIG. 1, are described in detail in the article by Orchard & Willson, entitled "New Active-Gyrator Circuit" as referenced above. It is to be understood that the two-port gyrator is to be used in an inductance simulation role. Thus, it is arranged as a single port network in which a capacitor is connected across the other port. In this case terminals 2 and 4 represent the terminals of the simulated inductor and capacitor 12 is connected between junctions 8 and 10, i.e., the junctions which form the second port. As explained in the referenced article, certain limitations are imposed on the resistive network consisting of resistors 14, 18, 26, 28 and 30. One set of resistors which would satisfy the conditions of an ideal gyrator would have the following relationships: resistors 14, 26, 28 and 30 would be equal to a value R; then 22 would be equal 2R, and resistor 18 would equal R/2. In the ideal case it is assumed that the operational amplifier 40 has infinite gain. While this is not actually attained in practice in the present day operational amplifiers the gain is normally sufficiently high so that they essentially act as an infinite gain amplifier. Further where the circuit is designed to operate at sufficiently low frequencies the effect of amplifier gain variation with frequency would be minimized and the impedance looking into the grounded port, i.e., between terminals 2 and 4 is $Z = e_1/i_1 = j\omega R^2 C$, where C is the capacitance of capacitor 12. Thus, the impedance of the network looks like an inductance of value $L = R^2 C$. By use of the active element, operational amplifier 40, a current i2 is introduced and this current is added in the gyrator network to the current which would normally be present in an inductor connected between terminals 2 and 4 of a passive network. Thus, an input current i1 is combined with an internally generated current i2, both of which would appear at the grounded terminals of the network as shown in FIG. 1. Because of the presence of this current, it is not possible to use the network shown in FIG. 1, to replace a floating inductor in a network. However, by connecting a cancellation network 44 to the gyrator circuit, it is possible to obtain a floating gyrator which may be used to replace floating inductors in filter networks.

Figure 2:
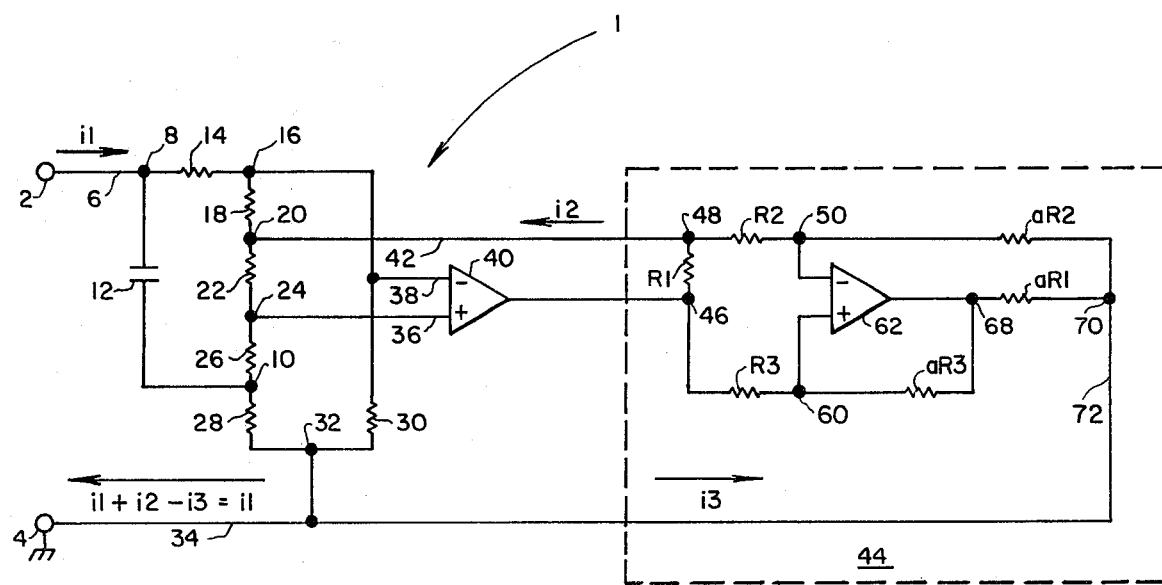
FIG. 2 is a circuit diagram of the floating gyrator of the instant invention which employs the single amplifier gyrator of FIG. 1, in conjunction with the cancellation network (44).

Referring now to FIG. 2, it may be seen that the output of operational amplifier 40, along path 42, has been opened and a resistor R1 has been inserted in the opening of this path between junctions 46 and 48. A second resistor R2 is connected between the junction 48 and junction 50, which is also connected to the inverting input of operational amplifier 62. Resistor R3 is connected between the output of operational amplifier 40, node 46 which is also connected to the non-inverting input of operational amplifier 62. In order for cancellation network 44 to cancel the effect of current i2, the current i3 must be of equal magnitude but opposite in sign from that of i2. The following analysis illustrates that this desired result is obtained. First the voltage at the inverting input to operational amplifier 62 is the reference and the magnitude is assumed to be zero for our analysis. Further, the operational amplifier is assumed to have infinite gain, and the voltage at node 46 is taken to be 1 volt. Because of the above assumptions, the voltage at the non-inverting input is zero and the voltage at the output of operational amplifier 62, node 68, is $-a$. If we specify that the voltage at node 48 is $+x$, then sinxe the voltage at the non-inverting input is zero, the voltage at node 70 is $-ax$.

The current i2, out of node 48, is then $i2=(1-x)/R1+(o-x)/R2$, i.e., the sum of the currents at node 48 must be equal to zero. Similarly the current i3, going into node 70, is $$i3 = \frac{(-ax+a)}{aR1} + \frac{(-ax-o)}{aR2} - \frac{(1-x)}{R1} + \frac{(o-x)}{R2},$$

i.e., i3 is equal to i2 but of opposite sense. Therefore, the current i2 developed in the gyrator circuit 1 is effectively cancelled, and the network shown in FIG. 2, may be used to replace a floating inductor in a filter network.

While the invention has been particularly shown and described with reference to a preferred embodiment thereof, it will be understood by those skilled in the art that change in form and detail may be made therein without departing from the spirit and scope of the invention.

What is claimed is:

1. A network for simulating an ungrounded inductor which comprises:
    a single operational amplifier gyrator circuit having an ungrounded port and a grounded port, said ungrounded port being terminated in a capacitor C so as to provide an input impedance, looking into the grounded port, which simulates an inductor, and in which a current i2 developed in said single operational amplifier appears at the grounded terminal of said grounded port; and
    a current cancellation circuit connected to said gyrator circuit, said current cancellation circuit deriving a current i3 which is equal to but opposite in sign from said i2 current, said i3 current being applied to said grounded terminal so as to effectively cancel the i2 current, whereby a simulated ungrounded inductor is obtained.

2. A network as specified in claim 1 wherein said gyrator circuit further comprises;
    a first resistance configuration comprising first and second resistors of equal resistance value R having one terminal ends thereof connected to form a first junction, having the other terminal end of said first resistor connected to the ungrounded terminal of said grounded port, and having the other terminal of said second resistor connected to the grounded terminal of said grounded port;
    a second resistance configuration having one terminal end of a third resistor of vaue R/2 connected to said first junction, having one terminal end of a fourth resistor of value 2R connected to the other terminal end of said third resistor, thereby forming a second junction, having one terminal end of a fifth resistor of value R connected to the other terminal end of said fourth resistor, thereby forming a third junction; and having a sixth resistor of value R having one terminal and thereof connected to the other terminal end of said fifth resistor, thereby forming a fourth junction, and having the other terminal end connected to said grounded terminal of the grouned port;
    means for connecting one terminal end of said capacitor C to the ungrounded terminal of the grounded port, and the other terminal end thereof to said fourth junction; and
    said single operational amplifier having an inverting input connected to said first junction, having a non-inverting input connected to said third junction, and means for connecting the output to said second junction.

3. A gyrator circuit as specified in claim 2 wherein the input impedance at said grounded port is $Zin = j\omega R^2 C$, where $\omega = 2\pi f$.

4. A network as specified in claim 2 or 3 wherein current said cancellation circuit further comprises;
    a second operational amplifier having inverting and non-inverting inputs and an output; and
    first, second and third pairs of resistors in which the ratio of resistance values for each pair is 1:a; the first resistor of said first pair having one terminal end connected to the output of said single operational amplifier and the other terminal end thereof connected to said second junction, and the second resistor of said first pair having one terminal end connected to the output of said second operational amplifier, and having the other terminal end thereof connected to the grounded terminal; the first resistor of said second pair having one terminal end connected to said second junction, and having the other terminal end thereof connected to the inverting input of said second operational amplifier, and having one terminal end of the second resistor of said second pair connected to the inverting input of said second operational amplifier, and the other terminal end thereof connected to said grounded terminal; and the first resistor of said third pair having one terminal end connected to said output of said single operational amplifier, and having the other terminal end thereof connected to said non-inverting input of said second operational amplifier, and the second resistor of said third pair having one terminal end connected to the non-inverting input of said second operational amplifier, and having the other terminal end thereof connected to the output of said second operational amplifier.

* * * * *

UNITED STATES PATENT AND TRADEMARK OFFICE
CERTIFICATE OF CORRECTION

PATENT NO. : 4,245,202
DATED : January 13, 1981
INVENTOR(S) : Christopher R. Huntley It is certified that error appears in the above-identified patent and that said Letters Patent are hereby corrected as shown below:

Column 3, line 30 (equation), " - " should read -- = --.

Column 4, line 18, "grouned" should read --grounded--.

Signed and Sealed this

Twenty-fifth Day of August 1981

[SEAL]

Attest:

GERALD J. MOSSINGHOFF

Attesting Officer     Commissioner of Patents and Trademarks